United States Patent
Lee et al.

(10) Patent No.: US 11,282,756 B2
(45) Date of Patent: Mar. 22, 2022

(54) ORGANIC INTERPOSER INCLUDING STRESS-RESISTANT BONDING STRUCTURES AND METHODS OF FORMING THE SAME

(71) Applicant: Taiwan Semiconductor Manufacturing Company Limited, Hsinchu (TW)

(72) Inventors: Tsung-Yen Lee, Hsinchu (TW); Chin-Hua Wang, New Taipei (TW); Ming-Chih Yew, Hsinchu (TW); Chia-Kuei Hsu, Hsinchu (TW); Po-Chen Lai, Hsinchu County (TW); Po-Yao Lin, Zhudong Township (TW); Shin-Puu Jeng, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 94 days.

(21) Appl. No.: 16/994,711

(22) Filed: Aug. 17, 2020

(65) Prior Publication Data
US 2022/0051959 A1    Feb. 17, 2022

(51) Int. Cl.
| H01L 23/14 | (2006.01) |
| H01L 23/00 | (2006.01) |
| H01L 21/768 | (2006.01) |
| H01L 23/538 | (2006.01) |
| H01L 23/60 | (2006.01) |

(52) U.S. Cl.
CPC ...... *H01L 23/145* (2013.01); *H01L 21/76802* (2013.01); *H01L 21/76877* (2013.01); *H01L 23/5384* (2013.01); *H01L 23/60* (2013.01); *H01L 24/14* (2013.01); *H01L 24/94* (2013.01)

(58) Field of Classification Search
CPC ..... H01L 23/145; H01L 23/5383–5387; H01L 23/498–4985; H01L 21/4853–486
See application file for complete search history.

(56) References Cited

U.S. PATENT DOCUMENTS

| 11,088,059 | B2* | 8/2021 | Chen | H01L 24/73 |
| 11,088,090 | B1* | 8/2021 | Brunner | H01L 23/5329 |
| 2015/0108621 | A1* | 4/2015 | Pabst | H01L 21/568 |
|  |  |  |  | 257/659 |
| 2019/0295912 | A1* | 9/2019 | Yu | H01L 25/0655 |
| 2020/0395280 | A1* | 12/2020 | Chen | H01L 21/56 |
| 2021/0202363 | A1* | 7/2021 | Chang Chien | H01L 23/49822 |
| 2021/0225780 | A1* | 7/2021 | Wu | H01L 23/49827 |

(Continued)

*Primary Examiner* — Bac H Au
(74) *Attorney, Agent, or Firm* — The Marbury Law Group, PLLC

(57) ABSTRACT

An organic interposer includes polymer matrix layers embedding redistribution interconnect structures, package-side bump structures, die-side bump structures and connected to a distal subset of the redistribution interconnect structures through a respective bump connection via structure. At least one metallic shield structure may laterally surround a respective one of the die-side bump structures. Shield support via structures may laterally surround a respective one of the bump connection via structures. Each metallic shield structure and the shield support via structures may be used to reduce mechanical stress applied to the redistribution interconnect structures during subsequent attachment of a semiconductor die to the die-side bump structures.

20 Claims, 11 Drawing Sheets

(56) References Cited

U.S. PATENT DOCUMENTS

2021/0242160 A1* 8/2021 Kang .................. H01L 23/5383
2021/0249361 A1* 8/2021 Brunner .............. H01L 23/5383
2021/0296221 A1* 9/2021 Yang .................. H01L 21/6835

* cited by examiner

ORGANIC INTERPOSER INCLUDING STRESS-RESISTANT BONDING STRUCTURES AND METHODS OF FORMING THE SAME

BACKGROUND

A fan-out wafer level package (FOWLP) may use an interposer between semiconductor dies and a package substrate. An acceptable interposer possesses sufficient mechanical strength to withstand bonding processes used to attach the semiconductor dies and the package substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
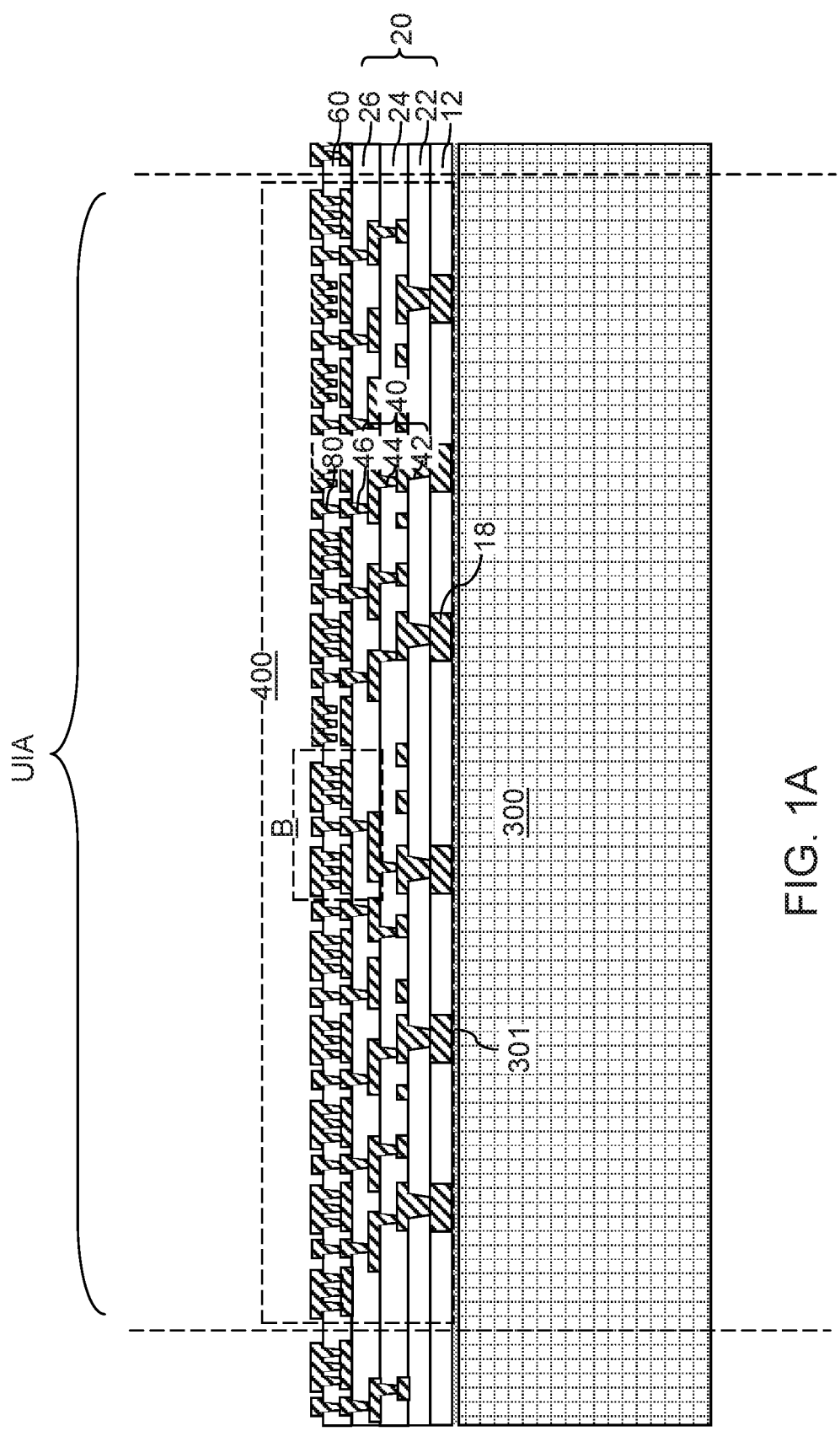
FIG. 1A is a vertical cross-sectional view of an exemplary structure including organic interposers formed over a carrier substrate according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and particularly to a chip package structure containing an organic interposer including stress-resistant bonding structures and method of forming the same, the various aspects of which are now described in detail.

Generally, the methods and structures of the present disclosure may be used to provide an organic interposer that may be resistant to stress-induced structural damage that may occur during an attachment of at least one semiconductor die thereto. Specifically, the application of an underfill material portion between an organic interposer and a semiconductor die typically induces mechanical stress on the organic interposer. Such application and induced stress may cause deformation or breakage of redistribution interconnect structures in the organic interposer. According to an aspect of the present disclosure, at least one metallic shield structure supported by shield support via structures may be formed around an array of die-side bump structures. After at least one semiconductor die is attached to the die-side bump structures, the at least one metallic shield structure may provide mechanical support to the underlying redistribution interconnect structures during an application of an underfill material and during subsequent handling of an assembly including the organic interposer and the at least one semiconductor die. The various aspects of the methods and structures of embodiments of the present disclosure are now described with reference to the accompanying drawings.

Figure 1C:
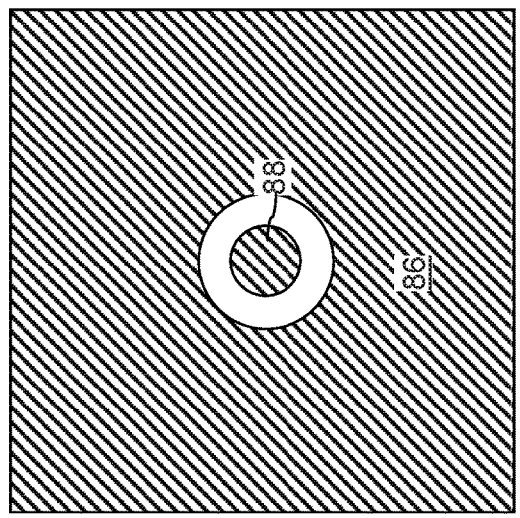
FIG. 1C is a horizontal cross-sectional view of a portion of the exemplary structure along the horizontal plane C-C' of FIG. 1B.
Figure 1E:
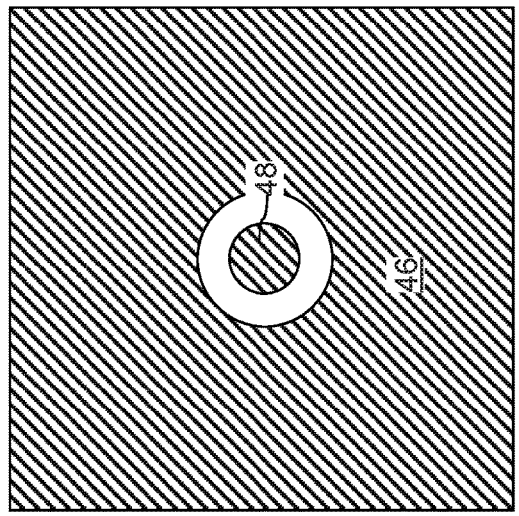
FIG. 1E is a horizontal cross-sectional view of a portion of the exemplary structure along the horizontal plane E-E' of FIG. 1B.
Figure 1B:
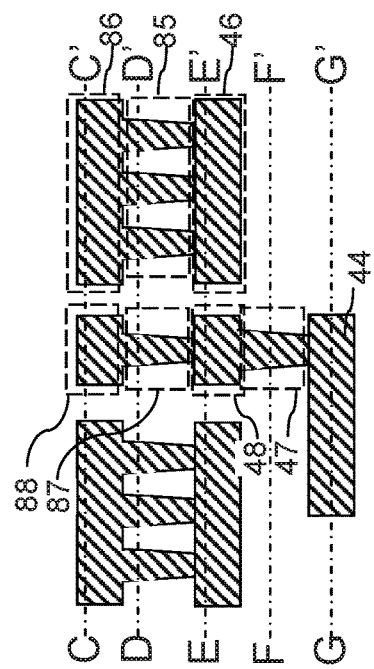
FIG. 1B is a magnified view of region B of FIG. 1A.
Figure 1D:
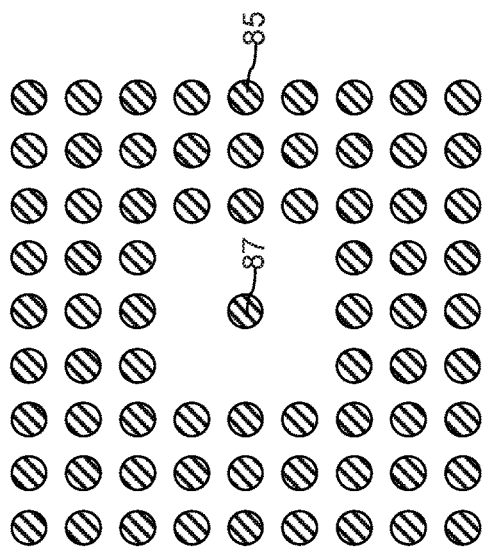
FIG. 1D is a horizontal cross-sectional view of a portion of the exemplary structure along the horizontal plane D-D' of FIG. 1B.
Figure 1G:
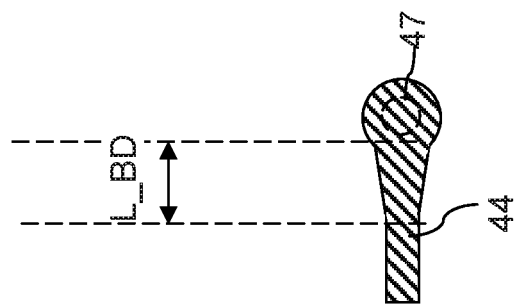
FIG. 1G is a horizontal cross-sectional view of a portion of the exemplary structure along the horizontal plane G-G' of FIG. 1B.
Figure 1F:
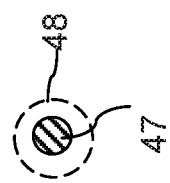
FIG. 1F is a horizontal cross-sectional view of a portion of the exemplary structure along the horizontal plane F-F' of FIG. 1B.

FIG. 1A is a vertical cross-sectional view of an exemplary structure including organic interposers formed over a carrier substrate according to an embodiment of the present disclosure. FIG. 1B is a magnified view of region B of FIG. 1A. FIG. 1C is a horizontal cross-sectional view of a portion of the exemplary structure along the horizontal plane C-C' of FIG. 1B. FIG. 1D is a horizontal cross-sectional view of a portion of the exemplary structure along the horizontal plane D-D' of FIG. 1B. FIG. 1E is a horizontal cross-sectional view of a portion of the exemplary structure along the horizontal plane E-E' of FIG. 1B. FIG. 1F is a horizontal cross-sectional view of a portion of the exemplary structure along the horizontal plane F-F' of FIG. 1B. FIG. 1G is a horizontal cross-sectional view of a portion of the exemplary structure along the horizontal plane G-G' of FIG. 1B. Referring to FIGS. 1A-1G, an exemplary structure according to an embodiment of the present disclosure includes organic interposers 400 formed over a carrier substrate 300. Each organic interposer 400 may be formed within a respective unit interposer area UIA. A two-dimensional array of organic interposers 400 may be formed on the carrier substrate 300. The carrier substrate 300 may be a circular wafer or a rectangular wafer. The lateral dimensions (such as the diameter of a circular wafer or a side of a rectangular wafer) of the carrier substrate 300 may be in a range from 100 mm to 500 mm, such as from 200 mm to 400 mm, although lesser and greater lateral dimensions may also be used. The carrier substrate 300 may include a semiconductor substrate, an insulating substrate, or a conductive substrate. The carrier substrate 300 may be transparent or opaque. The thickness of the carrier substrate 300 may be sufficient to provide mechanical support to an array of organic interposers 400 to be subsequently formed thereupon. For example, the thickness of the carrier substrate 300 may be in a range from 60 microns to 1 mm, although lesser and greater thicknesses may also be used.

An adhesive layer 301 may be applied to the top surface of the carrier substrate 300. In one embodiment, the carrier substrate 300 may include an optically transparent material such as glass or sapphire. In this embodiment, the adhesive layer 301 may include a light-to-heat conversion (LTHC) layer. The LTHC layer is a solvent-based coating applied using a spin coating method. The LTHC layer may form a layer that converts ultraviolet light to heat such that the LTHC layer loses adhesion. Alternatively, the adhesive layer 301 may include a thermally decomposing adhesive material. For example, the adhesive layer 301 may include an acrylic pressure-sensitive adhesive that decomposes at an elevated temperature. The debonding temperature of the thermally decomposing adhesive material may be in a range from 150 degrees to 400 degrees. Other suitable thermally decomposing adhesive materials that decompose at other temperatures are within the contemplated scope of disclosure.

Bump structures may be subsequently formed over the adhesive layer 301. The bump structures are subsequently used to provide bonding to a package substrate, and thus, are herein referred to as package-side bump structures 18. The package-side bump structures 18 may include any metallic material that may be bonded to a solder material. For example, an underbump metallurgy (UBM) layer stack may be deposited over the adhesive layer 301. The order of material layers within the UBM layer stack is selected such that solder material portions may be subsequently bonded to portions of the bottom surface of the UBM layer stack. Layer stacks that may be used for the UBM layer stack include, but are not limited to, stacks of Cr/Cr—Cu/Cu/Au, Cr/Cr—Cu/Cu, TiW/Cr/Cu, Ti/Ni/Au, and Cr/Cu/Au. Other suitable materials are within the contemplated scope of disclosure. The thickness of the UBM layer stack may be in a range from 5 microns to 60 microns, such as from 10 microns to 30 microns, although lesser and greater thicknesses may also be used.

A photoresist layer may be applied over the UBM layer stack, and may be lithographically patterned to form an array of discrete patterned photoresist material portions. An etch process may be performed to remove unmasked portions of the UBM layer stack. The etch process may be an isotropic etch process or an anisotropic etch process. Remaining portions of the UBM layer stack comprise the package-side bump structures 18. In one embodiment, the package-side bump structure 18 may be arranged as a two-dimensional array, which may be a two-dimensional periodic array such as a rectangular periodic array. In one embodiment, the package-side bump structures 18 may be formed as controlled collapse chip connection (C4) bump structures.

A polymer matrix layer, which is herein referred to as a proximal polymer matrix layer 12, may be deposited over the package-side bump structure 18. The proximal polymer matrix layer 12 may include a dielectric polymer material such as polyimide (PI), benzocyclobutene (BCB), or polybenzobisoxazole (PBO). Other suitable materials are within the contemplated scope of disclosure. The thickness of the proximal polymer matrix layer 12 may be in a range from 4 microns to 60 microns, although lesser and greater thicknesses may also be used.

Redistribution interconnect structures 40 and additional polymer matrix layers may be subsequently formed over the package-side bump structures 18 and the proximal polymer matrix layer 12. The additional polymer matrix layers are herein referred to collectively as interconnect-level polymer matrix layers 20. The interconnect-level polymer matrix layers 20 may include a plurality of polymer matrix layers (22, 24, 26) such as a first polymer matrix layer 22, a second polymer matrix layer 24, and a third polymer matrix layer 26. While the present disclosure is described using an embodiment in which three polymer matrix layers (22, 24, 26) embed redistribution interconnect structures 40, embodiments are expressly contemplated herein in which the interconnect-level polymer matrix layers 20 include two, four, or five or more polymer matrix layers.

The redistribution interconnect structures 40 include multiple levels of redistribution interconnect structures 40 that are formed through a respective one of the polymer matrix layers (22, 24, 26). The redistribution interconnect structures 40 may include metal via structures, metal line structures, and/or integrated line and via structures. Each integrated line and via structure includes a unitary structure containing a metal line structure and at least one metal via structure. A unitary structure refers to a single continuous structure in which each point within the structure may be connected by a continuous line (which may or may not be straight) that extends only within the structure.

In an illustrative example, the redistribution interconnect structures 40 may include first redistribution interconnect structures 42 that are formed through, and/or on a top surface of, the first polymer matrix layer 22; second redistribution interconnect structures 44 that are formed through, and/or on a top surface of, the second polymer matrix layer 24; and third redistribution interconnect structures (48, 47) that are formed through, and/or on a top surface of, the third polymer matrix layer 26. While the present disclosure is described using an embodiment in which the redistribution interconnect structures 40 are embedded within three polymer matrix layers (22, 24, 26), embodiments are expressly contemplated herein in which the redistribution interconnect structures 40 are embedded within one, two, or four or more polymer matrix layers.

Each of the interconnect-level polymer matrix layers 20 may include a dielectric polymer material such as polyimide (PI), benzocyclobutene (BCB), or polybenzobisoxazole (PBO). Other suitable materials are within the contemplated scope of disclosure. The thickness of each interconnect-level polymer matrix layer 20 may be in a range from 4 microns to 20 microns, although lesser and greater thicknesses may also be used. Each of the redistribution interconnect structures 40 includes at least one metallic material such as Cu, Mo, Co, Ru, W, TiN, TaN, WN, or a combination or a stack thereof. Other suitable materials are within the contemplated scope of disclosure. For example, each of the redistribution interconnect structures 40 may include a layer stack of a TiN layer and a Cu layer. In embodiments in which a redistribution interconnect structure 40 include a metal line structure, the thickness of the metal line structure may be in a range from 2 microns to 20 microns, although lesser and greater thicknesses may also be used.

The redistribution interconnect structures 40 located at a topmost metal interconnect level (such as the third redistribution interconnect structures (see e.g., FIG. 1B, 1F, 1G, reference nos. 48, 47)) may include metallic pad structures 48. The metallic pad structures 48 may be formed in the areas in which die-side bump structures 88 are to be subsequently formed. In one embodiment, the metallic pad structures 48 may be formed as a two-dimensional array.

In one embodiment, the metallic pad structures 48 may be formed as a pad portion of a respective unitary structure including a metallic pad structure 48 and a metallic via structure 47. For example, the metallic pad structures 48 may be located on a top surface of the third polymer matrix layer 26, and the metallic via structures 47 may vertically extend through the third polymer matrix layer 26. Each metallic via structure 47 connected to an overlying metallic pad structure 48 may contact a top surface of a respective underlying redistribution interconnect structure, which may be one of the second redistribution interconnect structure 44. In one embodiment, with reference to FIG. 1B, a second redistribution interconnect structure 44 contacting a bottom surface of a metallic via structure 47 may have an enlarged end portion to ensure that the metallic via structure 47 lands on a top surface of the second redistribution interconnect structure 44 despite overlay variations that may occur during patterning of the metallic via structure 47. In one embodiment, an outer periphery of the second redistribution interconnect structure 44 contacting a metallic via structure 47 may be laterally offset outward from a periphery of the bottom surface of the metallic via structure by a lateral distance that is greater than the maximum overlay tolerance of the lithographic process that patterns the shape for the metallic via structure 47. In one embodiment, the outer periphery of the second redistribution interconnect structure 44 may have a circular segment or may have an elliptical segment as illustrated in FIG. 1G.

With reference to FIGS. 1B and 1E, at least one metallic base plate 46 may be formed at the same level as the metallic pad structures 48. The shape of each metallic base plate 46 may be selected such that each metallic base plate 46 laterally surrounds at least one metallic pad structure 48. In one embodiment, each metallic pad structure 48 may be formed within an opening in a respective metallic base plate 46. In one embodiment, a single metallic base plate 46 may include a plurality of openings therethrough, and each of the metallic pad structures 48 within an organic interposer 400 may be located within a respective opening in the single metallic base plate 46. Alternatively, multiple metallic base plates 46 may be provided, and each of the metallic pad structures 48 within an organic interposer 400 may be located within an opening in a respective one of the metallic base plates 46. Generally, the metallic pad structures 48 and at least one metallic base plate 46 may be deposited over a topmost polymer matrix layer (such as the third polymer matrix layer 26) that embeds the metallic via structures 47 that are connected to the metallic pad structures 48.

An additional polymer matrix layer may be deposited over the metallic pad structures 48 and the at least one metallic base plate 46 of each organic interposer 400. The additional polymer matrix layer is herein referred to as a distal polymer matrix layer 60 (shown in FIG. 1A). The distal polymer matrix layer 60 includes a dielectric polymer material such as polyimide (PI), benzocyclobutene (BCB), or polybenzobisoxazole (PBO). Other suitable materials are within the contemplated scope of disclosure. The thickness of the distal polymer matrix layer 60 may be in a range from 4 microns to 60 microns, such as from 8 microns to 30 microns, although lesser and greater thicknesses may also be used. The proximal polymer matrix layer 12, the interconnect-level polymer matrix layer 20, and the distal polymer matrix layer 60 are collectively referred to as polymer matrix layers (12, 20, 60).

A photoresist layer may be applied over the distal polymer matrix layer 60, and may be lithographically patterned to form discrete openings therethrough. The openings in the photoresist layer include first openings that overlie a respective one of the metallic pad structures 48 and second openings that overlie the at least one metallic base plate 46. An anisotropic etch process may be performed to transfer the pattern of the openings in the photoresist layer through the distal polymer matrix layer 60. First via cavities and second via cavities are formed through the distal polymer matrix layer 60. The first via cavities extend to a top surface of a respective one of the metallic pad structures 48, and the second via cavities extend to a top surface of the at least one metallic base plate 46.

At least one metallic material may be deposited in the first via cavities and the second via cavities and over the top surface of the distal polymer matrix layer 60. The at least one metallic material may include any metallic material that may be bonded to a solder material. For example, the at least one metallic material may include an underbump metallurgy (UBM) layer stack. The order of material layers within the UBM layer stack is selected such that solder material portions may be subsequently bonded to portions of the top surface of the UBM layer stack. Layer stacks that may be used for the UBM layer stack include, but are not limited to, stacks of Cr/Cr—Cu/Cu/Au, Cr/Cr—Cu/Cu, TiW/Cr/Cu, Ti/Ni/Au, and Cr/Cu/Au. Other suitable materials are within the contemplated scope of disclosure. The thickness of the UBM layer stack may be in a range from 5 microns to 60 microns, such as from 10 microns to 30 microns, although lesser and greater thicknesses may also be used.

A photoresist layer may be applied over the at least one metallic material, and may be lithographically patterned to cover discrete areas overlying each first via cavity, and a continuous area or an array of discrete areas overlying the second via cavities. An etch process may be performed to remove unmasked portions of the at least one metallic material. With reference to FIGS. 1B-1E, first patterned portions of the at least one metallic material in, and over, the first via cavities comprise bonding structures, which are herein referred to as die-side bonding structures (88, 87). Second patterned portions of the at least one metallic material in, and over, the second via cavities comprise at least one metallic support structure (86, 85). The die-side bonding structures (88, 87) and the at least one metallic support structure (86, 85) are collectively referred to as bonding-level metallic structures 80.

Generally, the die-side bonding structures (88, 87) and the at least one metallic support structure (86, 85) may be formed directly on, and over, the metallic pad structures 48 and the at least one metallic base plate 46, respectively. Specifically, each die-side bonding structure (88, 87) may be formed directly on, and over, the metallic pad structures 48, and each metallic support structure (86, 85) may be formed directly on, and over, a respective metallic base plate 46. In one embodiment, each of the die-side bonding structures (88, 87) and the at least one metallic support structure (86, 85) may be formed as a respective unitary structure, i.e., a respective continuous structure.

In one embodiment, each of the die-side bonding structures (88, 87) comprises a respective first unitary structure containing a die-side bump structure 88 and a bump connection via structure 87 that may be electrically connected to a respective one of the redistribution interconnect structures 40. Each die-side bump structure 88 may be a patterned portion of a UBM layer stack that remains over a horizontal plane including the top surface of the distal polymer matrix layer 60, and each bump connection via structure 87 may be a patterned portion of the UBM layer stack that remains below the horizontal plane including the top surface of the distal polymer matrix layer 60. In one embodiment, each combination within the die-side bump structures 88 and the bump connection via structures 87 comprises a respective first unitary structure in which a first conductive material portion continuously extends across a respective die-side bump structure 88 and a respective bump connection via structure 87.

In one embodiment, each of the metallic support structures (86, 85) comprises a respective second unitary structure containing a metallic shield structure 86 and at least one shield support via structure 85 contacting a respective metallic base plate 46. Each metallic shield structure 86 may be a patterned portion of a UBM layer stack that remains over a horizontal plane including the top surface of the distal polymer matrix layer 60, and each shield support via structure 85 may be a patterned portion of the UBM layer stack that remains below the horizontal plane including the top surface of the distal polymer matrix layer 60. In one embodiment, each combination within the at least one metallic shield structure 86 and the shield support via structures 85 comprises a respective second unitary structure in which a second conductive material portion continuously extends across a respective metallic shield structure 86 and a respective plurality of shield support via structures 85. Each shield support via structure 85 provides mechanical support to a respective metallic shield structure 86 when pressure is applied to the metallic shield structure 86 (such as application of an underfill material in a subsequent processing step).

Each of the at least one metallic support structure (86, 85) laterally surrounds at least one of the die-side bonding structures (88, 87). The bump connection via structures 87 and the shield support via structures 85 may be formed through the distal polymer matrix layer 60. Each metallic support structure (86, 85) surrounds a respective one of the die-side bonding structures (88, 87). Each metallic shield structure 86 is located at a same level as the die-side bump structures 88, and the shield support via structures 85 are located at a same level as the bump connection via structures 87.

Generally, the package-side bump structures 18 may be located on a first side of the polymer matrix layers (12, 20, 60) and are connected to, and contact, a proximal subset of the redistribution interconnect structures 40. The die-side bonding structures (88, 87) may be located on a second side of the polymer matrix layers (12, 20, 60), and are connected to, and contact, a distal subset of the redistribution interconnect structures 40. In one embodiment, the die-side bump structures 88 may be located on the second side of the polymer matrix layers (12, 20, 60), and may be connected to a distal subset of the redistribution interconnect structures 40 through a respective bump connection via structure 87.

Within each organic interposer 400, at least one metallic shield structure 86 may be located at the same level as the die-side bump structures 88. Each metallic shield structure 86 laterally surrounds at least one die-side bump structure 88. In one embodiment, a metallic shield structure 86 may laterally surround a plurality of die-side bump structure 88. In this embodiment, each die-side bump structure 88 may be located within a respective opening in the metallic shield structure 86. In another embodiment, a metallic shield structure 86 may laterally surround a single die-side bump structure 88. Each opening in a metallic shield structure 86 may be circular, elliptical, polygonal, or of any planar two-dimensional closed shape. Each die-side bump structure 88 may have the same thickness as, and the same material composition as, the at least one metallic shield structure 86. Each die-side bump structure 88 and the at least one metallic shield structure 86 may comprise a respective UBM layer stack having a same layer composition. Each layer within the UBM layer stacks of the die-side bump structures 88 may have the same thickness as, and the same material composition as, a corresponding layer within the at least one metallic shield structure 86.

The shield support via structures 85 may be located at the same level as the bump connection via structures 87, and may laterally surround a respective one of the bump connection via structures 87. Each of at least one metallic base plate 46 contacts bottom surfaces of a respective plurality of shield support via structures 85 selected from the shield support via structures 85. The die-side bump structures 88 and the metallic shield structures 86 overlies, and contacts, a top surface of the distal polymer matrix layer 60, which is the topmost one of the polymer matrix layers (12, 20, 60).

Each metallic base plate 46 contacts bottom surfaces of at least one shield support via structure 85, and may contact bottom surfaces of a respective plurality of shield support via structures 85. In one embodiment, a metallic base plate 46 may contact bottom surfaces of a two-dimensional array of shield support via structures 85 that laterally surrounds a respective one of the bump connection via structures 87. The distal polymer matrix layer 60, which is the topmost one of the polymer matrix layers (12, 20, 60), laterally surrounds, and embeds, the bump connection via structures 87 and the shield support via structures 85.

In one embodiment, a metallic pad structure 48 may contact a bottom surface of a respective die-side bonding structures (88, 87) and may be connected to an underlying metallic via structure 47. The metallic pad structure 48 and the underlying metallic via structure 47 may be formed as an integrated structure. The underlying metallic via structure 47 may contact a top surface of an underlying metallic line structure, which may be a portion of a second redistribution interconnect structure 44, or a second redistribution interconnect structure 44. In one embodiment, the metallic pad structure 48 and the die-side bump structure 88 may have a circular shape, and may have a respective radius that is less than the radius of a rounded edge portion of the underlying metallic line structure (which may be a portion of a second redistribution interconnect structure 44, or a second redistribution interconnect structure 44). In one embodiment, with reference to FIG. 1G, the rounded edge portion of the underlying metallic line structure may have a bird's beak shape in which the width of the underlying metallic line structure decreases with a lateral distance from a region that contacts metallic via structure 47. The radii of the metallic pad structure 48 and the die-side bump structure 88 may be less than the lengthwise distance L_BD of the bird's beak shape. In an illustrative example, the bird's beak shape may have a lengthwise distance L_BD in a range from 3 microns to 200 microns, such as from 5 microns to 120 microns, and the radii of the metallic pad structure 48 and the die-side bump structure 88 may be less than the lengthwise distance.

In one embodiment, each metallic pad structure 48 may have a respective circular horizontal cross-sectional shape, and the radius of the circular horizontal cross-sectional shape may be in a range from 3 microns to 60 microns, such as from 5 microns to 30 microns, and/or from 5 microns to 20 microns, although lesser and greater dimensions may also be used. Each metallic pad structure 48 and may be surrounded by a respective metallic base plate 46 having a circular opening therethrough. The circular opening in the metallic base plate 46 may be concentric with the metallic pad structure 48. The gap between the metallic base plate 46 and the metallic pad structure 48 may be in a range from 1 micron to 20 microns, although lesser and greater gaps may also be used.

In one embodiment, each die-side bump structure 88 may have a respective circular horizontal cross-sectional shape, and the radius of the circular horizontal cross-sectional shape may be in a range from 3 microns to 60 microns, such as from 5 microns to 30 microns, and/or from 5 microns to 20 microns, although lesser and greater dimensions may also be used. Each die-side bump structure 88 and may be surrounded by a respective metallic shield structure 86 having a circular opening therethrough. The circular opening in the metallic shield structure 86 may be concentric with the die-side bump structure 88. The gap between the metallic shield structure 86 and the die-side bump structure 88 may be in a range from 1 micron to 20 microns, although lesser and greater gaps may also be used. Generally the maximum lateral dimension of each die-side bump structure 88 may be in a range from 6 microns to 120 microns, such as from 10 microns to 100 microns, although lesser and greater dimensions may also be employed.

Each shield support via structure 85 may have a shape of a circular cylinder or a circular frustum. Each shield support via structure 85 may have a substantially identical shape. The maximum radius of each shield support via structure 85 may be in a range from 1 micron to 20 microns, such as from 1 micron to 15 microns and/or from 1 microns to 10 microns, although lesser or greater radii may be used. The minimum radius of each shield support via structure 85 may be in a range from 30% to 100% of the maximum radius of a shield support via structure 85. In one embodiment, the shield support via structures 85 may be arranged as a two-dimensional periodic array such as a rectangular array or a hexagonal array. In this embodiment, the pitch of the shield support via structures 85 along any horizontal direction of periodicity may be in a range from 3 microns to 200 microns, such as from 10 microns to 100 microns, from 15 microns to 100 microns and/or from 15 microns to 60 microns, although lesser and greater pitches may also be used. The pitch between the bump connection via structure 87 and the adjacent shield support via structure 85 along any horizontal direction of periodicity may be in a range from 3 microns to 200 microns, such as from 10 microns to 100 microns, from 15 microns to 100 microns and/or from 15 microns to 60 microns, although lesser and greater pitches may also be used.

While the present disclosure is described using an embodiment in which each metallic pad structure 48 has a respective circular horizontal cross-sectional shape and each die-side bump structure 88 has a respective circular horizontal cross-sectional shape, embodiments are expressly contemplated herein in which the metallic pad structures 48 and/or the die-side bump structures 88 have polygonal horizontal cross-sectional shapes (such as rectangular shapes) or generally two-dimensional closed curvilinear cross-sectional shapes. Further, the shapes of each opening in the metallic shield structure(s) 86 and the metallic base plate(s) 46 may have a polygonal horizontal cross-sectional shape (such as a rectangular shape) or a generally two-dimensional closed curvilinear cross-sectional shape.

Figure 2B:
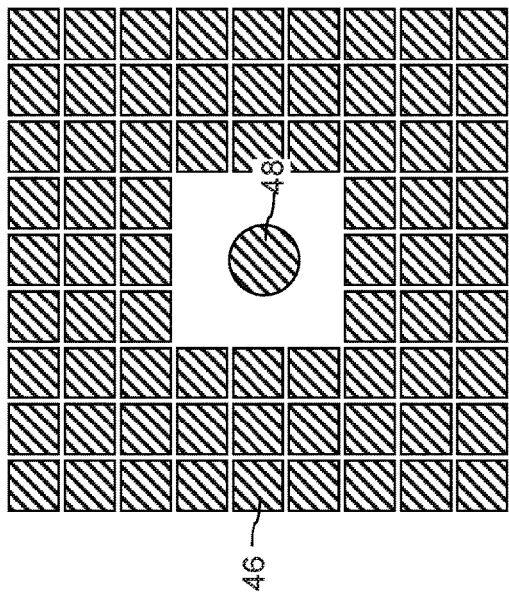
FIG. 2B is a horizontal cross-sectional view of a second alternative configuration of the exemplary structure along a horizontal plane that corresponds to the horizontal plane C-C' of FIG. 1B.
Figure 2C:
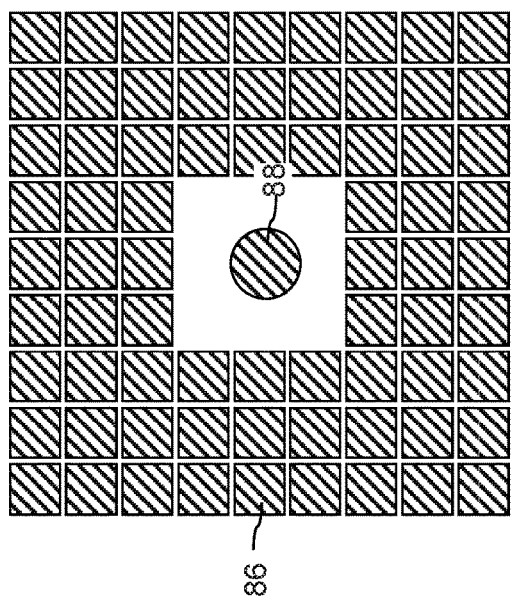
FIG. 2C is a horizontal cross-sectional view of a third alternative configuration of the exemplary structure along a horizontal plane that corresponds to the horizontal plane E-E' of FIG. 1B.
Figure 2A:
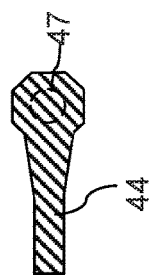
FIG. 2A is a horizontal cross-sectional view of a first alternative configuration of the exemplary structure along a horizontal plane that corresponds to the horizontal plane G-G' of FIG. 1B.

FIG. 2A is a horizontal cross-sectional view of a first alternative configuration of the exemplary structure along a horizontal plane that corresponds to the horizontal plane G-G' of FIG. 1B. The first alternative configuration of the exemplary structure may be derived from the first exemplary structure of FIGS. 1A-1G by modifying the shape of a second redistribution interconnect structure 44 contacting a bottom surface of a metallic via structure 47. Specifically, the enlarged end portion of the metallic line structure portion of the second redistribution interconnect structure 44 may have a polygonal peripheral segment in lieu of a circular peripheral segment illustrated in FIG. 1G. Generally, an outer periphery of the second redistribution interconnect structure 44 contacting a metallic via structure 47 may be laterally offset outward from a periphery of the bottom surface of the metallic via structure by a lateral distance that is greater than the maximum overlay tolerance of the lithographic process that patterns the shape for the metallic via structure 47.

FIG. 2B is a horizontal cross-sectional view of a second alternative configuration of the exemplary structure along a horizontal plane that corresponds to the horizontal plane C-C' of FIG. 1B. The second alternative configuration of the exemplary structure may be derived from the first exemplary structure of FIGS. 1A-1G by using an array of metallic shield structures 86 in lieu of a single metallic shield structure 86 around a die-side bump structures 88. In this embodiment, the array of metallic shield structures 86 may be a modification of a periodic two-dimensional array of metallic shield structures in which metallic shield structures are omitted around the die-side bump structure 88 to provide an opening, or a "cut-out" region. The array of metallic shield structures 86 may have a periodicity of a rectangular periodic array or a hexagonal periodic array among neighboring clusters of metallic shield structures 86. In one embodiment, each metallic shield structure 86 may have a rectangular horizontal cross-sectional shape or a hexagonal horizontal cross-sectional shape. Each metallic shield structure 86 is connected to at least one shield support via structure 85. In one embodiment, each metallic shield structure 86 is connected to a single shield support via structure 85. In another embodiment, each metallic shield structure 86 is connected to a respective array of shield support via structures 85. Each combination of a metallic shield structure 86 and at least one shield support via structure 85 may be formed as a unitary structure.

FIG. 2C is a horizontal cross-sectional view of a third alternative configuration of the exemplary structure along a horizontal plane that corresponds to the horizontal plane E-E' of FIG. 1B. The third alternative configuration of the exemplary structure may be derived from the first exemplary structure of FIGS. 1A-1G by using an array of metallic base plates 46 in lieu of a single metallic base plate 46 around a metallic pad structure 48. In this embodiment, the array of metallic base plates 46 may be a modification of a periodic two-dimensional array of metallic base plates in which metallic base plates are omitted around the metallic pad structure 48 to provide an opening, or a "cut-out" region. The array of metallic base plates 46 may have a periodicity of a rectangular periodic array or a hexagonal periodic array among neighboring clusters of metallic base plates 46. In one embodiment, each metallic base plates 46 may have a rectangular horizontal cross-sectional shape or a hexagonal horizontal cross-sectional shape. Each metallic base plates 46 is contacts at least one shield support via structure 85. In one embodiment, each metallic base plates 46 contacts a bottom surface of a single shield support via structure 85. In another embodiment, each metallic base plates 46 contacts a respective array of shield support via structures 85.

Figure 2D:
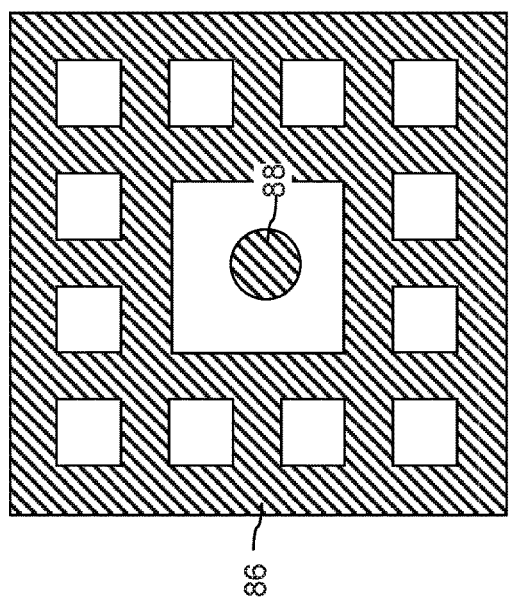
FIG. 2D is a horizontal cross-sectional view of a fourth alternative configuration of the exemplary structure along a horizontal plane that corresponds to the horizontal plane C-C' of FIG. 1B.

FIG. 2D is a horizontal cross-sectional view of a fourth alternative configuration of the exemplary structure along a horizontal plane that corresponds to the horizontal plane C-C' of FIG. 1B. The fourth alternative configuration of the exemplary structure may be derived from the first exemplary structure of FIGS. 1A-1G by using a metallic shield structure 86 in a grid configuration. The metallic shield structure can include a plurality of openings in addition to the openings that laterally surround a respective one of the die-side bump structure 88. The openings in the metallic shield structure 86 may, or may not, be periodic.

Figure 2E:
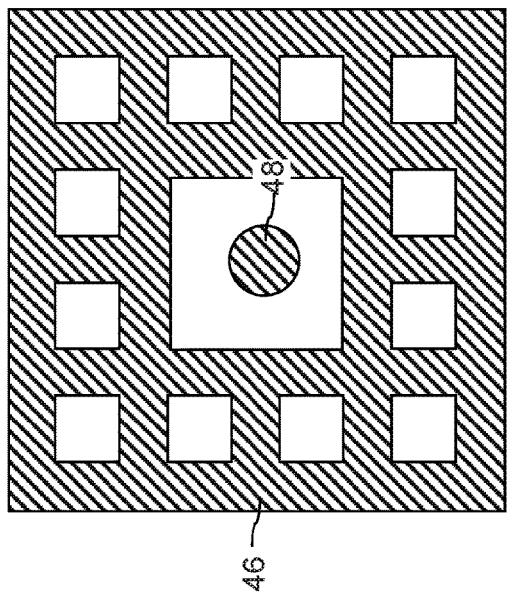
FIG. 2E is a horizontal cross-sectional view of a fifth alternative configuration of the exemplary structure along a horizontal plane that corresponds to the horizontal plane E-E' of FIG. 1B.

FIG. 2E is a horizontal cross-sectional view of a fifth alternative configuration of the exemplary structure along a horizontal plane that corresponds to the horizontal plane E-E' of FIG. 1B. The fifth alternative configuration of the exemplary structure may be derived from the first exemplary structure of FIGS. 1A-1G by employing a metallic base plate 46 in a grid configuration. In this embodiment, the metallic base plate 46 can include a plurality of openings in addition to the openings that laterally surround a respective one of the metallic pad structures 48. The openings in the metallic base plate 46 may, or may not, be periodic.

Various configurations of the exemplary structure may be derived from the exemplary structure of FIGS. 1A-1G by using one, two, or each of the alternative configurations illustrated in FIGS. 2A-2E.

Figure 3:
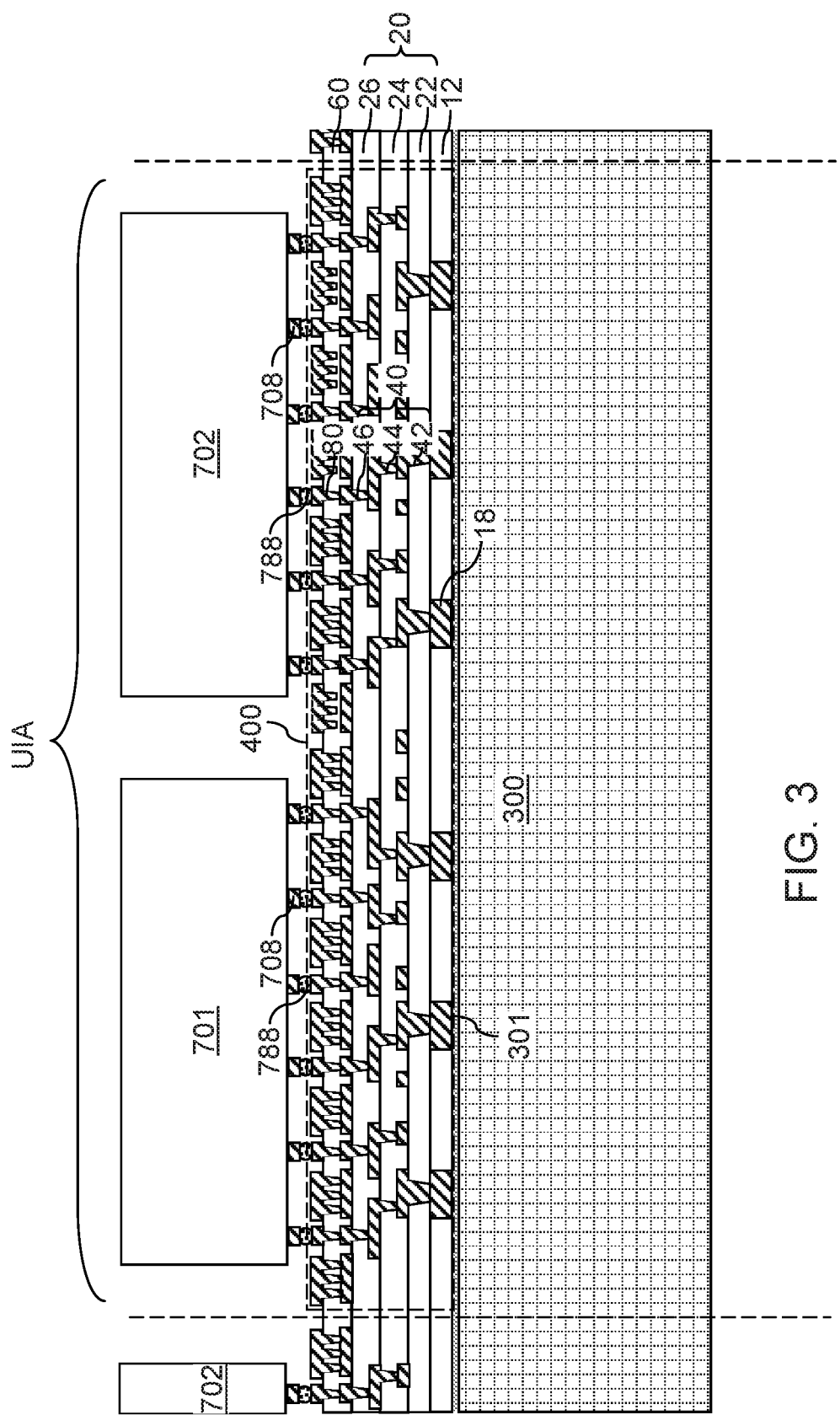
FIG. 3 is a vertical cross-sectional view of the exemplary structure after attaching semiconductor dies to the organic interposers according to an embodiment of the present disclosure.

FIG. 3 is a vertical cross-sectional view of the exemplary structure after attaching semiconductor dies to the organic interposers according to an embodiment of the present disclosure. Referring to FIG. 3, at least one semiconductor die (701, 702) may be attached to each organic interposer 400. Each semiconductor die (701, 702) may be bonded to a respective subset of the die-side bump structures 88 within a respective unit interposer area UIA through solder material portions 788. Each semiconductor die (701, 702) may comprise die bump structures 708. In one embodiment, the die bump structures 708 may comprise a two-dimensional array of microbump structures, and each semiconductor die (701, 702) may be attached to the die-side bump structure 88 by C2 bonding, i.e., solder bonding between a pair of microbumps. A C2 bonding process that reflows the solder material portions 788 may be performed after the die bump structures 708 of the semiconductor dies (701, 702) are disposed over the array of solder material portions 788.

The at least one semiconductor die (701, 702) may include any semiconductor die known in the art. In one embodiment, the at least one semiconductor die (701, 702) may include a system-on-chip (SoC) die such as an application processor die. In one embodiment, the at least one semiconductor die (701, 702) may include a plurality of semiconductor dies (701, 702). In one embodiment, the plurality of semiconductor dies (701, 702) may include a first semiconductor die 701 and at least one second semiconductor die 702. In one embodiment, the first semiconductor die 701 may be a central processing unit die, and the at least one second semiconductor die 702 may include a graphic processing unit die. In another embodiment, the first semiconductor die 701 may include a system-on-chip (SoC) die, and the at least one second semiconductor die 702 may include at least one high bandwidth memory (HBM) die, each of which includes a vertical stack of static random access memory dies and provides high bandwidth as defined under JEDEC standards, i.e., standards defined by The JEDEC Solid State Technology Association. The top surfaces of the semiconductor dies (701, 702) that are attached to a same organic interposer 400 may be positioned within a same horizontal plane.

Generally, at least one semiconductor die (701, 702) may be attached to the die-side bump structures 88 through at least one array of solder material portions 788.

Figure 4:
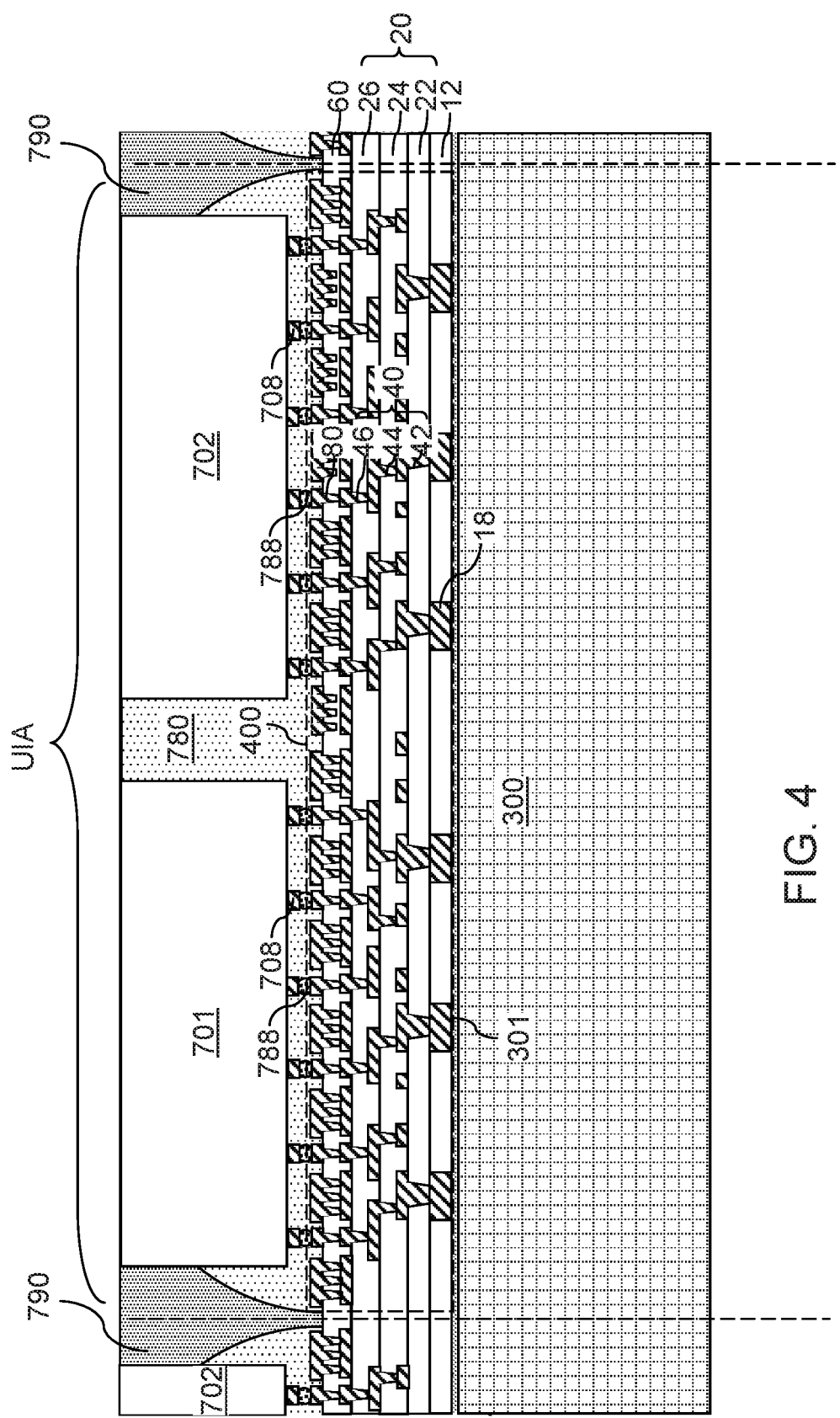
FIG. 4 is a vertical cross-sectional view of the exemplary structure after formation of fan-out wafer-level packages according to an embodiment of the present disclosure.

FIG. 4 is a vertical cross-sectional view of the exemplary structure after formation of fan-out wafer-level packages according to an embodiment of the present disclosure. Referring to FIG. 4, at least one underfill material portion 780 may be formed around each bonded array of solder material portions 788. Each underfill material portion 780 may be formed by injecting an underfill material around the array of solder material portions 788 after the solder material portions 788 are reflowed. Any known underfill material application method may be used, which may be, for example, the capillary underfill method, the molded underfill method, or the printed underfill method. In one embodiment, a plurality of semiconductor dies (701, 702) may be attached to an organic interposer 400 within each unit interposer area UIA, and a single underfill material portion 780 may continuously extend underneath the plurality of semiconductor dies (701, 702).

According to an aspect of the present disclosure, the metallic support structures (86, 85) and the metallic base plates 46 provide mechanical support to underlying structures within each organic interposer 400 during application and curing of the underfill material. Specifically, the underfill application process applies pressure to the distal polymer matrix layer 60. The combination of the metallic support structures (86, 85) and the metallic base plates 46 provide mechanical support to prevent, or reduce, distortion of the distal polymer matrix layer 60 during the underfill application process, and maintains the structural integrity of the organic interposers.

An epoxy molding compound (EMC) is applied to the gaps formed between the organic interposers 400 and the semiconductor dies (701, 702). The EMC includes an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC provides better handling, good flowability, less voids, better fill, and less flow marks. Solid EMC provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be lower than the release (debonding) temperature of the adhesive layer 301. For example, the curing temperature of the EMC may be in a range from 125° C. to 150° C.

The EMC may be cured at a curing temperature to form an EMC matrix that laterally encloses each of the semiconductor dies (701, 702). The EMC matrix includes a plurality of epoxy molding compound (EMC) frames 790 that are laterally adjoined to one another. Each EMC die frame 790 is located within a respective unit interposer area UIA, and laterally surrounds and embeds a respective set of at least one semiconductor die (701, 702), which may be a plurality of semiconductor dies (701, 702). Excess portions of the EMC may be removed from above the horizontal plane including the top surfaces of the semiconductor dies (701, 702) by a planarization process, which may use chemical mechanical planarization.

Figure 5:
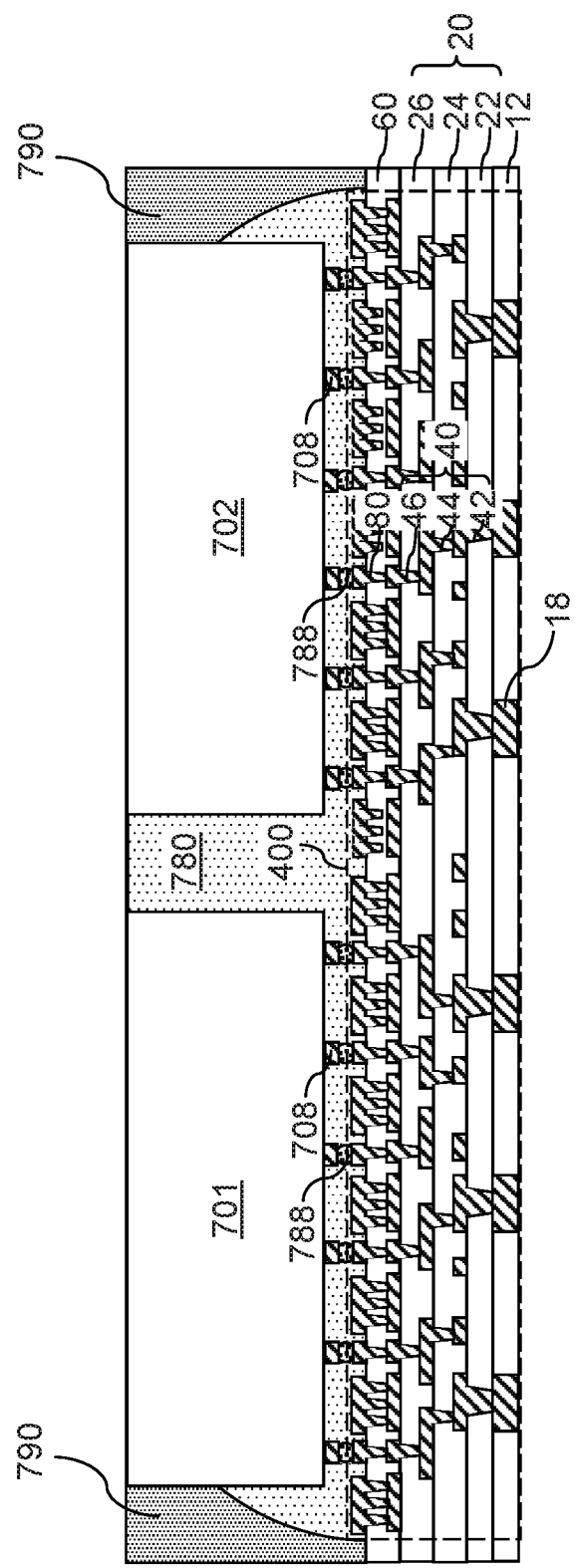
FIG. 5 is a vertical cross-sectional view of the exemplary structure after dicing the fan-out wafer-level packages according to an embodiment of the present disclosure.

FIG. 5 is a vertical cross-sectional view of the exemplary structure after dicing the fan-out wafer-level packages according to an embodiment of the present disclosure. Referring to FIG. 5, the carrier substrate 300 may be detached from the assembly of the organic interposers 400, the semiconductor dies (701, 702), and the EMC die frames 790. The adhesive layer 301 may be deactivated, for example, by a thermal anneal at an elevated temperature. Embodiments may include an adhesive layer 301 that includes a thermally-deactivated adhesive material. In other embodiments in which the carrier substrate 300 may be transparent, an adhesive layer 301 may include an ultraviolet-deactivated adhesive material.

The assembly of the organic interposers 400, the semiconductor dies (701, 702), and the EMC die frames 790 may be diced along the dicing channels, which are located along the boundaries of the unit interposer areas. Each diced portion of the organic interposers 400, the semiconductor dies (701, 702), and the EMC die frames 790 comprises a fan-out wafer-level package (FOWLP), which includes at least one semiconductor die (701, 702) (which may be a plurality of semiconductor dies), an organic interposer 400, an underfill material portion 780, and an EMC die frame 790. The EMC die frame 790 and the organic interposer 400 may have vertically coincident sidewalls, i.e., sidewalls located within a same vertical plane. In embodiments in which the FOWLP includes a plurality of semiconductor dies (701, 702), the underfill material portion 780 may contact sidewalls of the plurality of semiconductor dies (701, 702). The EMC die frame 790 continuously extends around, and laterally encircles, the at least one semiconductor die (701, 702) within the FOWLP.

Figure 6:
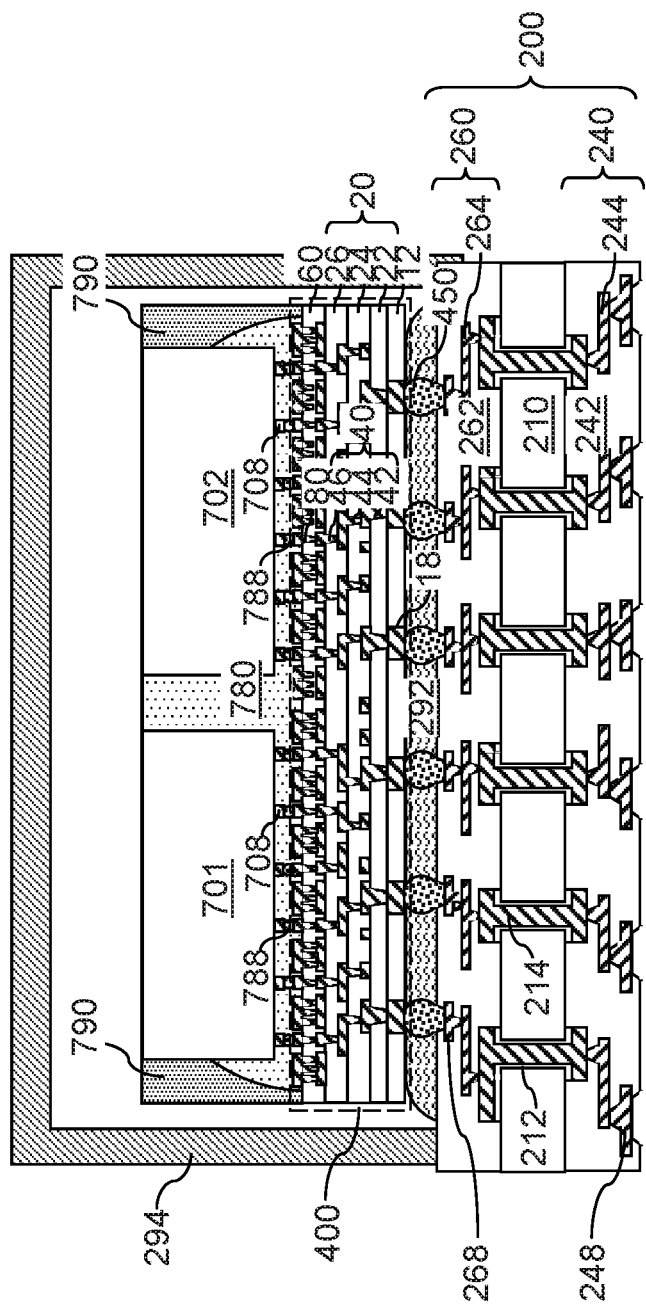
FIG. 6 is a vertical cross-sectional view of the exemplary structure after attaching a package substrate to the fan-out wafer-level package according to an embodiment of the present disclosure.

FIG. 6 is a vertical cross-sectional view of the exemplary structure after attaching a package substrate to the fan-out wafer-level package according to an embodiment of the present disclosure. Referring to FIG. 6, a package substrate 200 may be provided. The package substrate 200 may be a cored package substrate including a core substrate 210, or a coreless package substrate that does not include a package core. Alternatively, the package substrate 200 may include a system-integrated package substrate (SoIS) including redistribution layers and/or dielectric interlayers, at least one embedded interposer (such as a silicon interposer). Such a system-integrated package substrate may include layer-to-layer interconnections using solder material portions, microbumps, underfill material portions (such as molded underfill material portions), and/or an adhesion film. While the present disclosure is described using an exemplary substrate package, it is understood that the scope of the present disclosure is not limited by any particular type of substrate package and may include a SoIS.

The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The package substrate 200 may include board-side surface laminar circuit (SLC) 240 and a chip-side surface laminar circuit (SLC) 260. The board-side SLC 240 may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262. An array of board-side bonding pads 248 may be electrically connected to the board-side wiring interconnects 244, and may be configured to allow bonding through solder balls. An array of chip-side bonding pads 268 may be electrically connected to the chip-side wiring interconnects 264, and may be configured to allow bonding through C4 solder balls.

The solder material portions 450 attached to the package-side bump structures 18 of an assembly of the organic interposer 400, at least one semiconductor die (701, 702), and the EMC die frame 790 may be disposed on the array of the chip-side bonding pads 268 of the package substrate 200. A reflow process may be performed to reflow the solder material portions 450, thereby inducing bonding between the organic interposer 400 and the package substrate 200. In one embodiment, the solder material portions 450 may include C4 solder balls, and the assembly of the organic interposer 400, the at least one semiconductor die (701, 702), and the EMC die frame 790 may be attached to the package substrate 200 using an array of C4 solder balls. An underfill material portion 292 may be formed around the solder material portions 450 by applying and shaping an underfill material. Optionally, a stabilization structure 294, such as a cap structure or a ring structure, may be attached to the assembly of the organic interposer 400, the at least one semiconductor die (701, 702), the EMC die frame 790, and the package substrate 200 to reduce deformation of the assembly during subsequent processing steps and/or during usage of the assembly.

Figure 7:
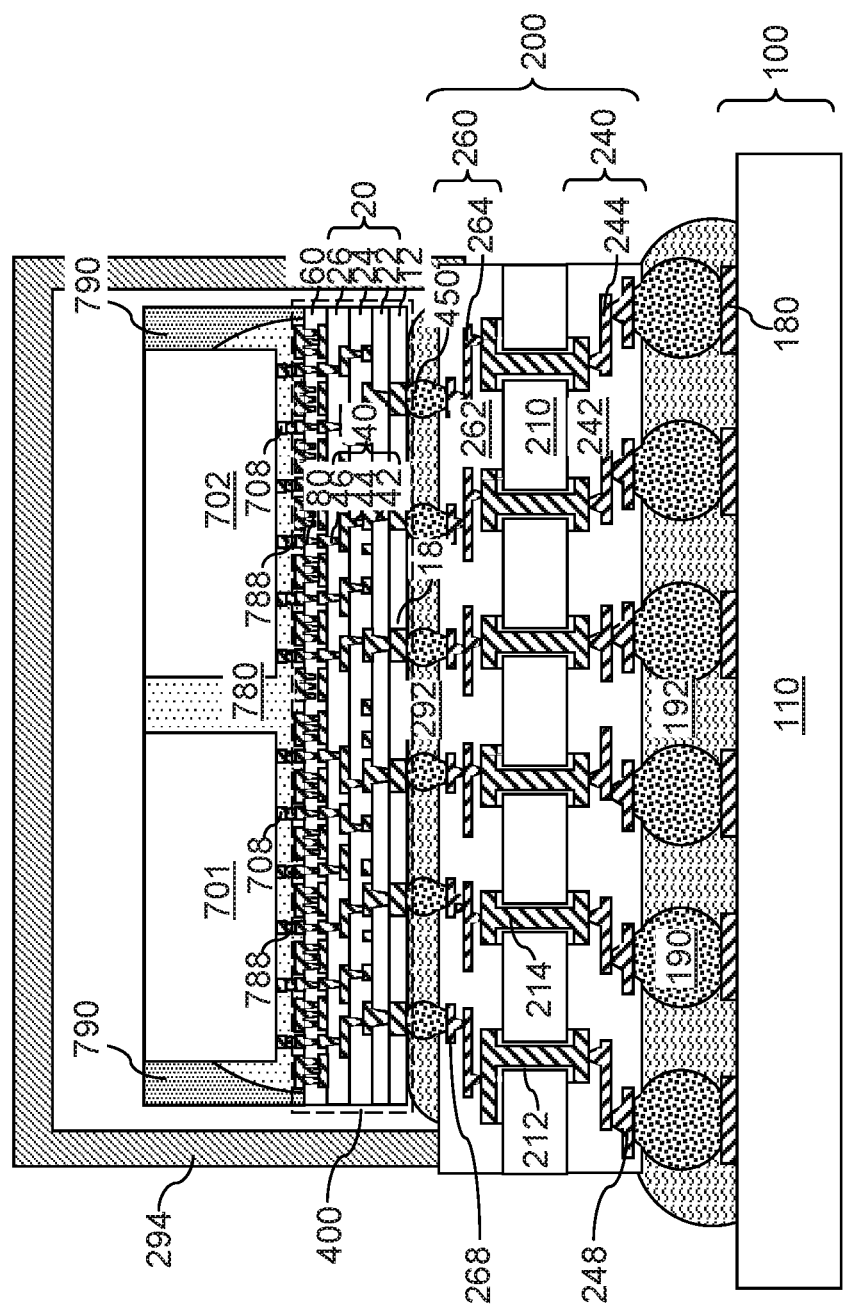
FIG. 7 is a vertical cross-sectional view of the exemplary structure after attaching the package substrate to a printed circuit board (PCB) according to an embodiment of the present disclosure.

FIG. 7 is a vertical cross-sectional view of the exemplary structure after attaching the package substrate to a printed circuit board (PCB) according to an embodiment of the present disclosure. Referring to FIG. 7, a printed circuit board (PCB) 100 including a PCB substrate 110 and PCB bonding pads 180 may be provided. The PCB substrate 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An underfill material portion 192 may be formed around the solder joints 190 by applying and shaping an underfill material. The package substrate 200 is attached to the PCB substrate 100 through the array of solder joints 190.

Figure 8:
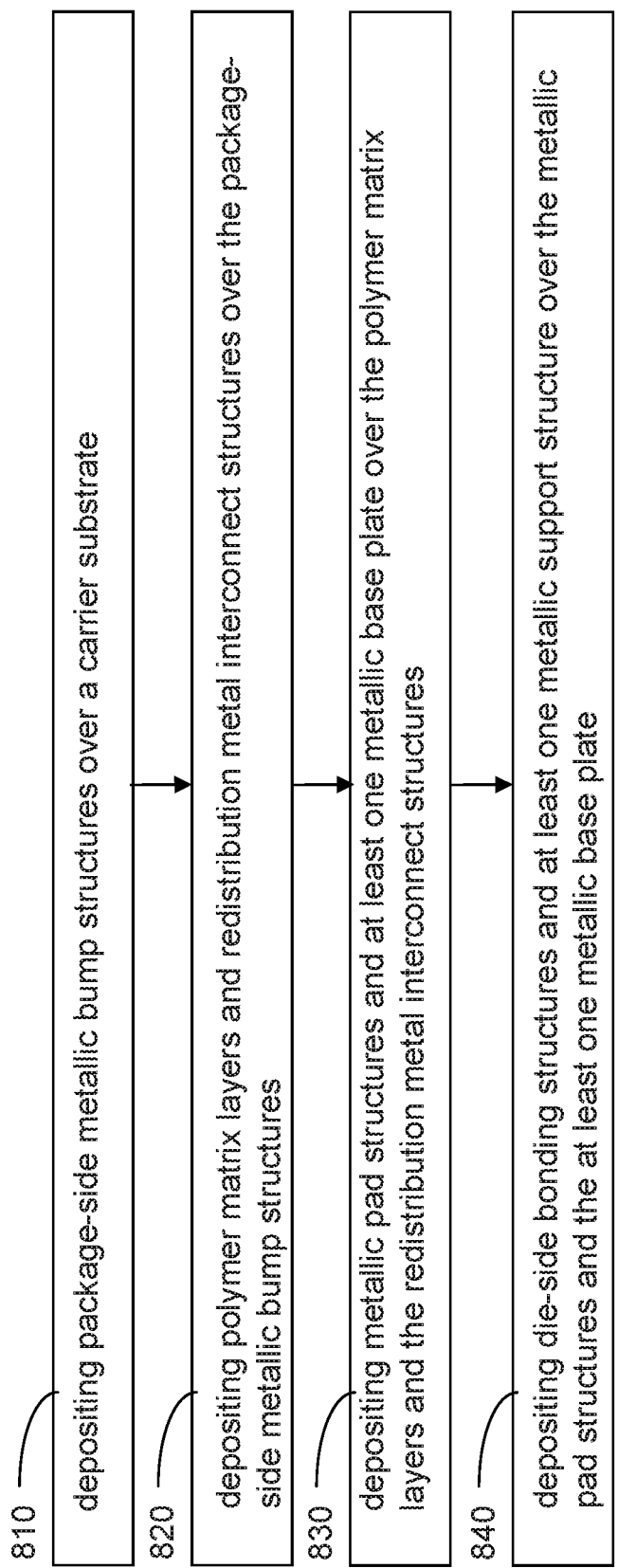
FIG. 8 is a flowchart illustrating steps for forming an organic interposer according to an embodiment of the present disclosure.

Referring to FIG. 8, a flowchart illustrating steps for forming an organic interposer 400 of embodiments of the present disclosure is illustrated. Referring to step 810 and FIGS. 1A-2C, package-side bump structures 18 are deposited over a carrier substrate 300. Referring to step 820 and FIGS. 1A-2C, polymer matrix layers (12, 20) and redistribution interconnect structures 40 are deposited over the package-side bump structures 18. Referring to step 830 and FIGS. 1A-2C, metallic pad structures 48 and at least one metallic base plate 46 are deposited over the polymer matrix layers (12, 20) and the redistribution interconnect structures 40. Referring to step 840 and FIGS. 1A-2C, die-side bonding structures (88, 87) and at least one metallic support structure (86, 85) are formed over the metallic pad structures 48 and the at least one metallic base plate 46. Each of the die-side bonding structures (88, 87) comprises a respective first unitary structure containing a die-side bump structure 88 and a bump connection via structure 87 that is electrically connected to a respective one of the redistribution interconnect structures 40. Each of the at least one metallic support structure (86, 85) laterally surrounds at least one of the die-side bonding structures (88, 87), and comprises a respective second unitary structure containing a metallic shield structure 86 and at least one shield support via structure 85. Subsequently, the processing steps of FIGS. 3-7 may be performed to form a semiconductor structure such as a FOWLP bonded to a package substrate 200, and optionally to a PCB substrate 100.

Referring to FIGS. 1A-8 and according to various embodiments of the present disclosure, a chip package structure including an organic interposer 400 and at least one semiconductor die (701, 702) attached to the organic interposer 400 is provided. The organic interposer 400 comprises: polymer matrix layers (12, 20, 60) embedding redistribution interconnect structures 40; package-side bump structures 18 located on a first side of the polymer matrix layers (12, 20, 60) and connected to, and contacting, a proximal subset of the redistribution interconnect structures 40; die-side bump structures 88 located on a second side of the polymer matrix layers (12, 20, 60) and connected to a distal subset of the redistribution interconnect structures 40 through a respective bump connection via structure 87; at least one metallic shield structure 86 located at a same level as the die-side bump structures 88 and laterally surrounding a respective one of the die-side bump structures 88; and shield support via structures 85 located at a same level as the bump connection via structures 87 and laterally surrounding a respective one of the bump connection via structures 87.

In one embodiment, the die-side bump structures 88 have a same thickness as, and a same material composition as, the at least one metallic shield structure 86. In one embodiment, the organic interposer 400 comprises at least one metallic base plate 46 contacting bottom surfaces of the bump connection via structures 87. In one embodiment, the redistribution interconnect structures 40 comprise metallic pad structures 48 contacting a bottom surface of a respective one of the bump connection via structures 87 and located at a same level as, and laterally surrounded by, the at least one metallic base plate 46. In one embodiment, each of at least one metallic base plate 46 contacts bottom surfaces of a respective plurality of shield support via structures 85 selected from the shield support via structures 85.

In one embodiment, each combination within the die-side bump structures 88 and the bump connection via structures 87 comprises a respective first unitary structure in which a first conductive material portion continuously extends across a respective die-side bump structure 88 and a respective bump connection via structure 87. In one embodiment, each combination within the at least one metallic shield structure 86 and the shield support via structures 87 comprises a respective second unitary structure in which a second conductive material portion continuously extends across a respective metallic shield structure 86 and a respective plurality of shield support via structures 85. In one embodiment, the die-side bump structures 88 and the at least one metallic shield structure 86 have a same thickness and have a same material composition. In one embodiment, the die-side bump structures 88 and the at least one metallic shield structure 86 may have a respective UBM layer stack.

In one embodiment, at least one semiconductor die (701, 702) may be bonded through a respective array of solder material portions 788 to the die-side bump structures 88. In one embodiment, a package substrate 200 may be bonded to the package-side bump structures 18 through another array of solder material portions 450.

According to another aspect of the present disclosure, a structure comprising an organic interposer 400 is provided. The organic interposer 400 comprises: polymer matrix layers 20 embedding redistribution interconnect structures 40; package-side bump structures 18 located on a first side of the polymer matrix layers 20 and connected to, and contacting, a proximal subset of the redistribution interconnect structures 40; die-side bonding structures (88, 87) located on a second side of the polymer matrix layers (12, 20, 60) and connected to a distal subset of the redistribution interconnect structures 40, wherein each of the die-side bonding structures (88, 87) comprises a respective first unitary structure containing a die-side bump structure 88 and a bump connection via structure 87 that is connected to a respective one of the redistribution interconnect structures 40; and at least one metallic support structure (86, 85) laterally surrounding a respective one of the die-side bonding structures (88, 87), wherein each of the at least one metallic support structure (86, 85) comprises a respective second unitary structure containing a metallic shield structure 86 and at least one shield support via structure 85, wherein the metallic shield structure 86 is located at a same level as the die-side bump structures 88, and the shield support via structures 85 are located at a same level as the bump connection via structures 87.

In one embodiment, the organic interposer 400 comprises at least one metallic base plate 46 contacting a bottom surface of at least one of the shield support via structures 85.

In one embodiment, each metallic base plate 46 may contact bottom surfaces of a respective plurality of shield support via structures 85 such as an array of shield support via structures 85. In one embodiment, the redistribution interconnect structures 40 comprise metallic pad structures 48 contacting a bottom surface of a respective one of the bump connection via structures 87 and located at a same level as, and laterally surrounded by, the at least one metallic base plate 46.

In one embodiment, a topmost one of the polymer matrix layers (12, 20, 60) (such as a distal polymer matrix layer 60) laterally surrounds, and embeds, the bump connection via structures 87 and the shield support via structures 85. In one embodiment, the die-side bump structures 88 and the metallic shield structures 86 overlie, and contact, a top surface of the topmost one of the polymer matrix layers (12, 20, 60) (such as a distal polymer matrix layer 60).

The various structures and methods of the present disclosure may be used to provide a stress-resistant organic interposer 400 that deforms less during an underfill process and/or subsequent handling processes. At least one metallic support structure (86, 85) including a respective metallic shield structure 86 and respective shield support via structures 87 may be used to enhance structural strength of the organic interposer 400.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package structure including an organic interposer and at least one semiconductor die attached to the organic interposer, wherein the organic interposer comprises:
   polymer matrix layers embedding redistribution interconnect structures;
   package-side bump structures located on a first side of the polymer matrix layers and connected to a proximal subset of the redistribution interconnect structures;
   die-side bump structures located on a second side of the polymer matrix layers and connected to a distal subset of the redistribution interconnect structures through a respective bump connection via structure;
   at least one metallic shield structure located at a same level as the die-side bump structures and laterally surrounding a respective one of the die-side bump structures; and
   shield support via structures located at a same level as the bump connection via structures and laterally surrounding a respective one of the bump connection via structures.

2. The chip package structure of claim 1, wherein the die-side bump structures have a same thickness as, and a same material composition as, the at least one metallic shield structure.

3. The chip package structure of claim 1, wherein the organic interposer comprises at least one metallic base plate contacting a bottom surface of at least one of the shield support via structures.

4. The chip package structure of claim 3, wherein the redistribution interconnect structures comprise metallic pad structures contacting a bottom surface of a respective one of the bump connection via structures and located at a same level as, and laterally surrounded by, the at least one metallic base plate.

5. The chip package structure of claim 3, wherein each of at least one metallic base plate contacts bottom surfaces of a respective plurality of shield support via structures selected from the shield support via structures.

6. The chip package structure of claim 1, wherein each combination within the die-side bump structures and the bump connection via structures comprises a respective first unitary structure in which a first conductive material portion continuously extends across a respective die-side bump structure and a respective bump connection via structure.

7. The chip package structure of claim 6, wherein each combination within the at least one metallic shield structure and the shield support via structures comprises a respective second unitary structure in which a second conductive material portion continuously extends across a respective metallic shield structure and a respective plurality of shield support via structures.

8. The chip package structure of claim 7, wherein the die-side bump structures and the at least one metallic shield structure have a same thickness and have a same material composition.

9. The chip package structure of claim 1, wherein:
   the at least one semiconductor die is bonded to the die-side bump structures through a respective array of solder material portions; and
   a package substrate is bonded to the package-side bump structures through an array of solder material portions.

10. The chip package structure of claim 9, further comprising at least one underfill material portion located around each bonded array of solder material portions and contacts the at least one semiconductor die and the organic interposer, wherein the at least one semiconductor die is located on one side of the organic interposer and the package substrate is located on an opposite side of the organic interposer.

11. A structure comprising an organic interposer, the organic interposer comprising:
   polymer matrix layers embedding redistribution interconnect structures;
   package-side bump structures located on a first side of the polymer matrix layers and connected to a proximal subset of the redistribution interconnect structures;
   die-side bonding structures located on a second side of the polymer matrix layers and connected to a distal subset of the redistribution interconnect structures, wherein each of the die-side bonding structures comprises a respective first unitary structure containing a die-side bump structure and a bump connection via structure that is connected to a respective one of the redistribution interconnect structures; and
   at least one metallic support structure laterally surrounding a respective one of the die-side bonding structures, wherein each of the at least one metallic support structure comprises a respective second unitary structure containing a metallic shield structure and at least one shield support via structure, wherein the metallic shield structure is located at a same level as the die-side bump structures, and the shield support via structures are located at a same level as the bump connection via structures.

12. The structure of claim 11, wherein the organic interposer comprises at least one metallic base plate contacting a bottom surface of the at least one of the shield support via structure.

13. The structure of claim 12, wherein the redistribution interconnect structures comprise metallic pad structures contacting a bottom surface of a respective one of the bump connection via structures and located at a same level as, and laterally surrounded by, the at least one metallic base plate.

14. The structure of claim 11, wherein a topmost one of the polymer matrix layers laterally surrounds, and embeds, the bump connection via structures and the at least one shield support via structure.

15. The structure of claim 14, wherein the die-side bump structures and the metallic shield structures overlie, and contact, a top surface of the topmost one of the polymer matrix layers.

16. A method of forming a semiconductor structure, the method comprising forming an organic interposer by:
    depositing package-side bump structures over a carrier substrate;
    depositing polymer matrix layers and redistribution interconnect structures over the package-side bump structures;
    depositing pad structures and at least one metallic base plate over the polymer matrix layers and the redistribution interconnect structures; and
    depositing die-side bonding structures and at least one metallic support structure over the pad structures and the at least one metallic base plate,
    wherein:
    each of the die-side bonding structures comprises a respective first unitary structure containing a die-side bump structure and a bump connection via structure that is connected to a respective one of the redistribution interconnect structures; and
    each of the at least one metallic support structure laterally surrounds at least one of the die-side bonding structures, and comprises a respective second unitary structure containing a metallic shield structure and at least one shield support via structure.

17. The method of claim 16, wherein forming the organic interposer comprises forming an additional polymer matrix layer over the pad structures and the at least one metallic base plate, wherein the bump connection via structures and the at least one shield support via structure is formed through the additional polymer matrix layer.

18. The method of claim 16, wherein forming the organic interposer comprises:
    forming first via cavities and second via cavities through the additional polymer matrix layer; and
    depositing and patterning at least one metallic material in the first via cavities and the second via cavities, wherein first patterned portions of the at least one metallic material in, and over, the first via cavities comprise the die-side bonding structures, and second patterned portions of the at least one metallic material in, and over, the second via cavities comprise the at least one metallic support structure.

19. The method of claim 16, further comprising attaching at least one semiconductor die to the die-side bump structures through at least one array of solder material portions.

20. The method of claim 16, further comprising:
    detaching the carrier substrate from the organic interposer; and
    attaching a package substrate to the package-side bump structures through an array of solder material portions.

* * * * *